US012652039B2

(12) United States Patent (10) Patent No.: US 12,652,039 B2
Soliman et al. (45) Date of Patent: Jun. 9, 2026

(54) METHOD AND APPARATUS FOR PROCESSING INPUT VARIABLES

(71) Applicant: Robert Bosch GmbH, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 59 days.

(21) Appl. No.: 18/625,904

(22) Filed: Apr. 3, 2024

(65) Prior Publication Data

US 2024/0348246 A1 Oct. 17, 2024

(30) Foreign Application Priority Data

Apr. 11, 2023 (DE) ..................... 10 2023 203 274.0

(51) Int. Cl.
| | |
|---|---|
| *H03K 17/00* | (2006.01) |
| *H03K 17/16* | (2006.01) |
| *H03K 17/30* | (2006.01) |
| *H03K 17/687* | (2006.01) |
| *H03K 19/0185* | (2006.01) |

(52) U.S. Cl.
CPC ......... *H03K 17/162* (2013.01); *H03K 17/302* (2013.01); *H03K 17/687* (2013.01); *H03K 19/018514* (2013.01)

(58) Field of Classification Search
CPC .. H03K 17/162; H03K 17/302; H03K 17/687; H03K 19/018514; G11C 11/4063; G06F 7/5443; G06F 7/49; G06F 9/30003; G06N 4/063
See application file for complete search history.

(56) References Cited

U.S. PATENT DOCUMENTS

| | | | | | |
|---|---|---|---|---|---|
| 5,568,069 | A | * | 10/1996 | Chow | H03K 19/1738 |
| | | | | | 326/98 |
| 6,038,229 | A | * | 3/2000 | Cooperman | H04L 49/1553 |
| | | | | | 370/243 |
| 7,053,654 | B1 | * | 5/2006 | Young | H03K 19/1778 |
| | | | | | 326/39 |
| 7,373,291 | B2 | * | 5/2008 | Garst | G06V 30/262 |
| | | | | | 704/4 |
| 10,607,660 | B2 | * | 3/2020 | Kim | G11C 11/4093 |
| 12,009,048 | B2 | * | 6/2024 | Shin | G11C 5/147 |

OTHER PUBLICATIONS

S. Kingra et al., "Time-Multiplexed In-Memory Computation Scheme for Mapping Quantized Neural Networks on Hybrid CMOS-OxRAM Building Blocks," Published in IEEE Transactions on Nanotechnology, 2022 (vol. 21), pp. 406-412.

(Continued)

*Primary Examiner* — Tuan T Lam
(74) *Attorney, Agent, or Firm* — NORTON ROSE FULBRIGHT US LLP

(57) ABSTRACT
A method for processing input variables, comprising: application of a first input variable to a control electrode of a first transistor; application of a second input variable to a current leakage device, wherein the current leakage device is designed to connect a load path of the first transistor selectively to a first circuit node or a second circuit node based on the second input variable.

19 Claims, 6 Drawing Sheets

(56)                  References Cited

OTHER PUBLICATIONS

V. Parmar et al., "Demonstration of Differential Mode Ferroelectric Field-Effect Transistor Array-Based in-Memory Computing Macro for Realizing Multiprecision Mixed-Signal Artificial Intelligence Accelerator," Advanced Intelligent Systems Editors' Choice, vol. 5, Issue 6, Jun. 2023, pp. 1-8.

V. Parmar et al., "Hardware-Efficient Stochastic Binary CNN Architectures for Near-Sensor Computing," Frontiers in Neuroscience, Jan. 2022, vol. 15, pp. 1-11.

* cited by examiner

230 ⌐⌐ apply first input variable to control electrode of first transistor

↓ 110-1a, E1

232 ⌐⌐ apply second input variable to control electrode of second transistor

↓ 120, E2

234 ⌐ apply first input variable to control electrode of second transistor

↓ 110-2a, E1

236 ⌐ ascertain output variable

↓ A1'

240 ⌐⌐ use FET as first transistor

↓ FET

242 ⌐⌐ use FeFET as first and/or second transistor

↓ FeFET

300

304a DAT　304b PRG

PRG'

VMM

400

| 401 | 402 | 403 | 404 | encode ternary values provide circuit for carrying out binary or ternary multiplication and/or accumulation operations use of transistors for carrying out ternary multiplication and/or accumulation operations acceleration of an inference of artificial neural networks

METHOD AND APPARATUS FOR PROCESSING INPUT VARIABLES

FIELD

The present invention relates to a method for processing input variables.

The present invention furthermore relates to an apparatus for processing input variables.

SUMMARY

Exemplary embodiments of the present invention relate to a method, for example a computer-implemented method, for processing input variables, comprising: application of a first input variable to a control electrode of a first transistor; application of a second input variable to a current leakage device, wherein the current leakage device is designed to connect a load path of the first transistor selectively to a first circuit node or a second circuit node based on the second input variable. This makes it possible to process the input variables with further exemplary embodiments.

With further exemplary embodiments of the present invention, it is provided that the method comprises: ascertainment of an output variable based on at least one of the following elements: a) a variable that characterizes a current flowing through the first circuit node, b) a variable that characterizes a current flowing through the second circuit node.

With further exemplary embodiments of the present invention, it is provided that the method comprises: ascertainment of the variable that characterizes the current flowing through the first circuit node, by means of a first, for example current-based, analog-to-digital converter device; ascertainment of the variable that characterizes the current flowing through the second circuit node, by means of a second, for example current-based, analog-to-digital converter device.

With further exemplary embodiments of the present invention, it is provided that the method comprises: ascertainment of a difference between the variable that characterizes the current flowing through the first circuit node and the variable that characterizes the current flowing through the second circuit node, by means of a differential, for example current-based, analog-to-digital converter device.

With further exemplary embodiments of the present invention, it is provided that the first input variable is a binary variable.

With further exemplary embodiments of the present invention, it is provided that the second input variable is a binary variable, wherein, for example, the second input variable characterizes a sign, for example "plus" or "minus." In this way, ternary variables can thus, for example, be processed, which can, for example, assume the three values of "−1," "0," "1."

With further exemplary embodiments of the present invention, it is provided that the method comprises: application of the first input variable to a control electrode of a second transistor, wherein the current leakage device is designed, if the second input variable has a first state, to connect the load path of the first transistor to the first circuit node and a load path of the second transistor to the second circuit node, and wherein the current leakage device is designed, if the second input variable has a second state, to connect the load path of the first transistor to the second circuit node and the load path of the second transistor to the first circuit node.

With further exemplary embodiments of the present invention, it is provided that the method comprises: use of a field effect transistor, FET, for example MOSFET; as the first transistor and/or a or the second transistor.

With further exemplary embodiments of the present invention, it is provided that the method comprises: use of a ferroelectric field effect transistor, FeFET, as the first transistor and/or a or the second transistor.

With further exemplary embodiments of the present invention, it is provided that the method comprises at least one of the following elements: a) setting, for example programming, of a threshold voltage of at least the first transistor based on the first input variable, b) setting of a threshold voltage of the first transistor to a first, for example comparatively low, value (for example with respect to possible values of the first input variable), c) setting of a threshold voltage of the second transistor to a second, for example comparatively high, value (for example with respect to possible values of the first input variable).

With further exemplary embodiments of the present invention, it is provided that the method comprises: characterizing, for example encoding, of a magnitude of a ternary variable by means of at least the first transistor and/or the first input variable; characterizing, for example encoding, of a sign (for example, plus, "+," or minus, "−") of the ternary variable by means of the second input variable.

Further exemplary embodiments of the present invention relate to an apparatus for executing the method according to the embodiments.

With further exemplary embodiments of the present invention, it is provided that the apparatus comprises the first transistor, the current leakage device, and, optionally, at least one or the second transistor, wherein, for example, the apparatus has a control apparatus for controlling at least one aspect of the method according to the embodiments.

With further exemplary embodiments of the present invention, it is provided that the first transistor and the second transistor are provided, wherein the first input variable can be applied to control electrodes of the first transistor and of the second transistor, wherein, for example, the control electrodes of the first transistor and of the second transistor are connected to one another.

With further exemplary embodiments of the present invention, it is provided that a) a first terminal of a load path of the first transistor is connected to a first terminal of the current leakage device, and/or b) that a second terminal of a load path of the first transistor is connected to a first reference potential, for example a ground potential, and/or that c) a first terminal of a load path of the second transistor is connected to a second terminal of the current leakage device and/or d) that a second terminal of a load path of the second transistor is connected to the first reference potential.

With further exemplary embodiments of the present invention, it is provided that the current leakage device has a first transistor, wherein the first terminal of the current leakage device can be selectively connected to the second circuit node by means of the first transistor based on the second input variable, wherein the current leakage device has a second transistor, wherein the first terminal of the current leakage device can be selectively connected to the first circuit node by means of the second transistor based on the second input variable.

With further exemplary embodiments of the present invention, it is provided that the current leakage device has a third transistor, wherein the second terminal of the current leakage device can be selectively connected to the second circuit node by means of the third transistor based on the second input variable, wherein the current leakage device has a fourth transistor, wherein the second terminal of the current leakage device can be selectively connected to the first circuit node by means of the fourth transistor based on the second input variable.

Further exemplary embodiments of the present invention relate to a computing device, for example a vector-matrix multiplication device, comprising at least one device according to the example embodiments of the present invention.

Further exemplary embodiments of the present invention relate to a computer-readable storage medium comprising commands that, when executed by a computer, cause said computer to carry out the method according to the example embodiments of the present invention.

Further preferred embodiments of the present invention relate to a computer program comprising commands that, when the program is executed by a computer, cause said computer to carry out the method according to the example embodiments of the present invention.

Further exemplary embodiments of the present invention relate to a data carrier signal that transmits and/or characterizes the computer program according to the example embodiments of the present invention.

Further exemplary embodiments of the present invention relate to a use of the method according to the embodiments and/or of the apparatus according to the embodiments and/or of the computing device according to the embodiments and/or of the computer-readable storage medium according to the embodiments and/or of the computer program according to the embodiments and/or of the data carrier signal according to the embodiments for at least one of the following aspects: a) encoding of, for example ternary, values, for example weights, b) provision of a circuit for carrying out, for example binary or ternary, multiplication and/or accumulation operations, for example multiply and accumulate (MAC), c) use of transistors, for example of the FeFET type, for carrying out ternary multiplication and/or accumulation operations, for example multiply and accumulate (MAC), d) acceleration, for example hardware-based acceleration, of an inference of ternary artificial neural networks.

Further features, possible applications and advantages of the present invention will be apparent from the following description of exemplary embodiments of the present invention shown in the figures. In this case, all of the features described or shown form the subject matter of the present invention individually or in any combination, irrespective of their wording or representation in the description or in the figures.

DETAILED DESCRIPTION OF EXAMPLE EMBODIMENTS

Figure 1:
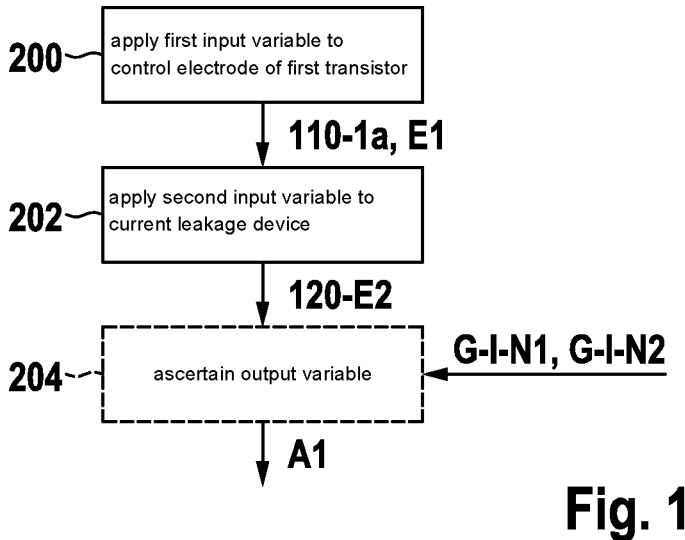
FIG. 1 schematically shows a simplified flow diagram according to exemplary embodiments of the present invention.
Figure 2:
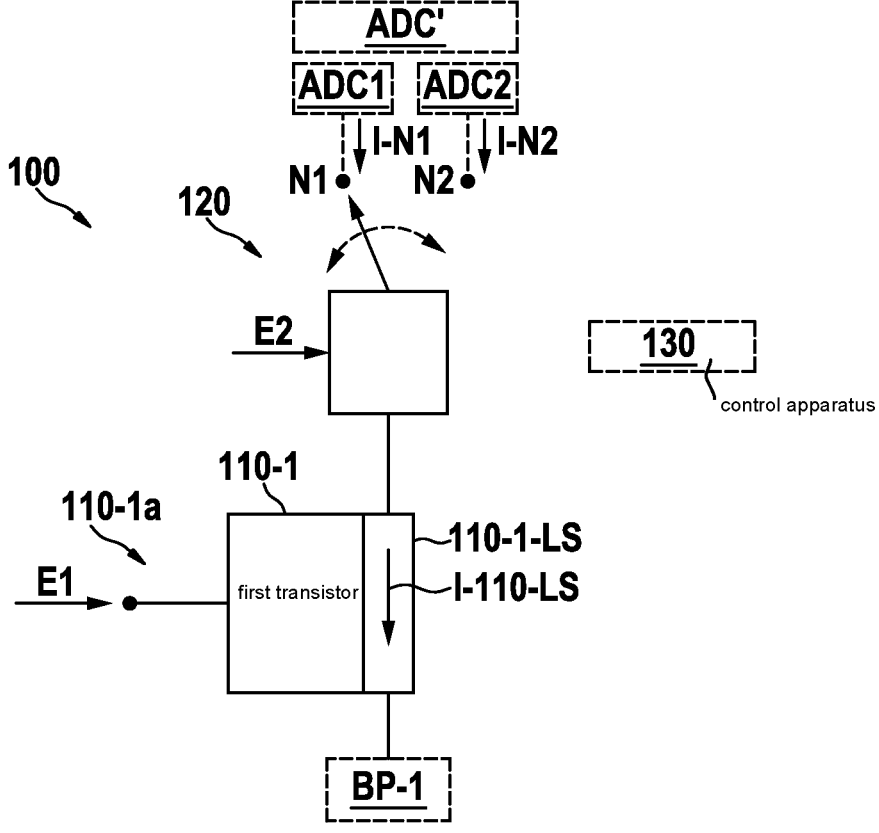
FIG. 2 schematically shows a simplified block diagram according to exemplary embodiments of the present invention.

Exemplary embodiments, see FIG. 1, 2, relate to a method, for example a computer-implemented method, for processing input variables, comprising: application 200 of a first input variable E1 to a control electrode 110-1a (FIG. 2) of a first transistor 110-1; application 202 (FIG. 1) of a second input variable E2 to a current leakage device 120, wherein the current leakage device 120 is designed to connect a load path 110-1-LS of the first transistor 110-1 selectively to a first circuit node N1 or a second circuit node N2 based on the second input variable E2. With further exemplary embodiments, this makes it possible to process the input variables E1, E2, for example to carry out calculations, which are explained in more detail later by way of example.

For example, the current leakage device 120 is connected to a first terminal (not shown in FIG. 2) of the load path 110-1-LS, and a second terminal of the load path 110-1-LS is connected to a reference potential BP-1, for example the ground potential. In this way, for example, any current I-110-LS flowing through the load path 110-1-LS (for example, with corresponding control of the first transistor 110-1 with the first input variable E1) can, for example, be leaked selectively from the first circuit node N1 or from the second circuit node N2, cf. the currents I-N1, I-N2 according to FIG. 2, based on the second input signal E2.

With further exemplary embodiments, FIG. 1, it is provided that the method comprises: ascertainment 204 of an output variable A1 based on at least one of the following elements: a) a variable G-I-N1 that characterizes a current I-N1 flowing through the first circuit node N1 (FIG. 2), b) a variable G-I-N2 that characterizes a current I-N2 flowing through the second circuit node N2. With further exemplary embodiments, the output variable A1 or a value of the output variable A1 depends on at least one of the following elements: a) first input variable E1, b) second input variable E2, c) property/properties of the first transistor 110-1.

With further exemplary embodiments, the variables G-I-N1, G-I-N2 can, for example, directly be the respective currents, for example a respective progression of the currents over time. With further exemplary embodiments, the variables G-I-N1, G-I-N2 can, for example, also be voltages associated with the respective currents I-N1, I-N2.

Figure 3:
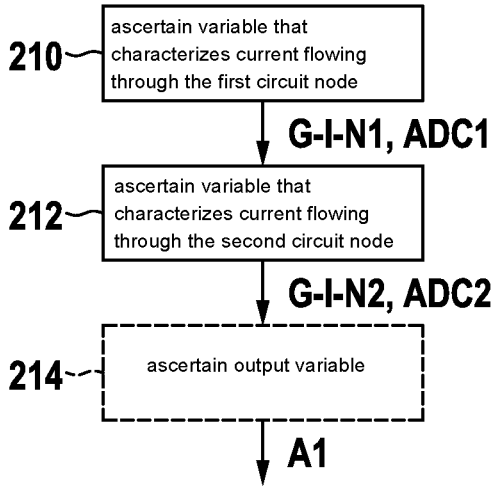
FIG. 3 schematically shows a simplified flow diagram according to exemplary embodiments of the present invention.

With further exemplary embodiments, FIG. 3, it is provided that the method comprises: ascertainment 210 of the variable G-I-N1 that characterizes the current I-N1 flowing through the first circuit node N1, by means of a first, for example current-based (or current-driven), analog-to-digital converter device ADC1 (FIG. 2); ascertainment 212 of the variable G-I-N2 that characterizes the current I-N2 flowing through the second circuit node N2, by means of a second, for example current-based, analog-to-digital converter device ADC2. The optional block 214 according to FIG. 3 symbolizes the ascertainment of the output variable A1, for example based on the information obtained according to block 210 and block 212.

Figure 4:
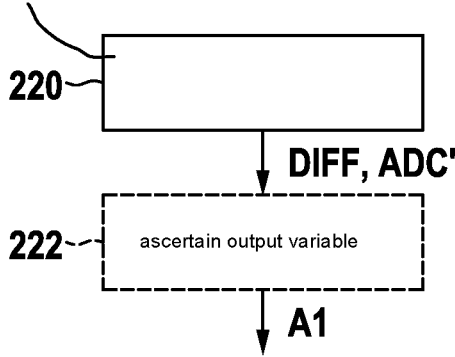
FIG. 4 schematically shows a simplified flow diagram according to exemplary embodiments of the present invention.

With further exemplary embodiments, FIG. 4, it is provided that the method comprises: ascertainment 220 of a difference DIFF between the variable G-I-N1 that characterizes the current I-N1 flowing through the first circuit node N1 and the variable G-I-N2 that characterizes the current I-N2 flowing through the second circuit node N2, by means of a differential, for example current-based, analog-to-digital converter device ADC'. The optional block 222 according to FIG. 4 symbolizes the ascertainment of the output variable A1, for example based on the information DIFF obtained according to block 220.

With further exemplary embodiments, it is provided that the first input variable E1 is a binary variable, for example it can assume the values 1 or 0, or logic one or logic zero. With further exemplary embodiments, the load path 110-1-LS of the first transistor 110-1 thus becomes low-ohmic, for example, if the control electrode 110-1a is controlled according to the value of "1" for the first input variable. With further exemplary embodiments, the load path 110-1-LS of the first transistor 110-1 thus becomes high-ohmic, for example, if the control electrode 110-1a is controlled according to the value of "0" for the first input variable.

With further exemplary embodiments, it is provided that the second input variable E2 is a binary variable, wherein, for example, the second input variable characterizes a sign, for example "plus" or "minus." In this way, the apparatus 100 according to FIG. 2 can thus, for example, be used to process ternary variables, which can, for example, assume the three values of "−1," "0," "1."

With further exemplary embodiments, the configuration 110-1, 120 according to FIG. 2 can be combined, for example, with further transistors and/or current leakage devices (not shown), wherein, for example, the further transistors and/or current leakage devices also act on the first or second circuit node N1, N2 (for example based on a corresponding second input variable for a further current leakage device) so that, for example, the currents of the different transistors can be combined, for example added. As a result, with further exemplary embodiments, multiplication and/or accumulation operations, such as multiply and accumulate (MAC) operations, can, for example, be carried out on a hardware basis.

Figure 5:
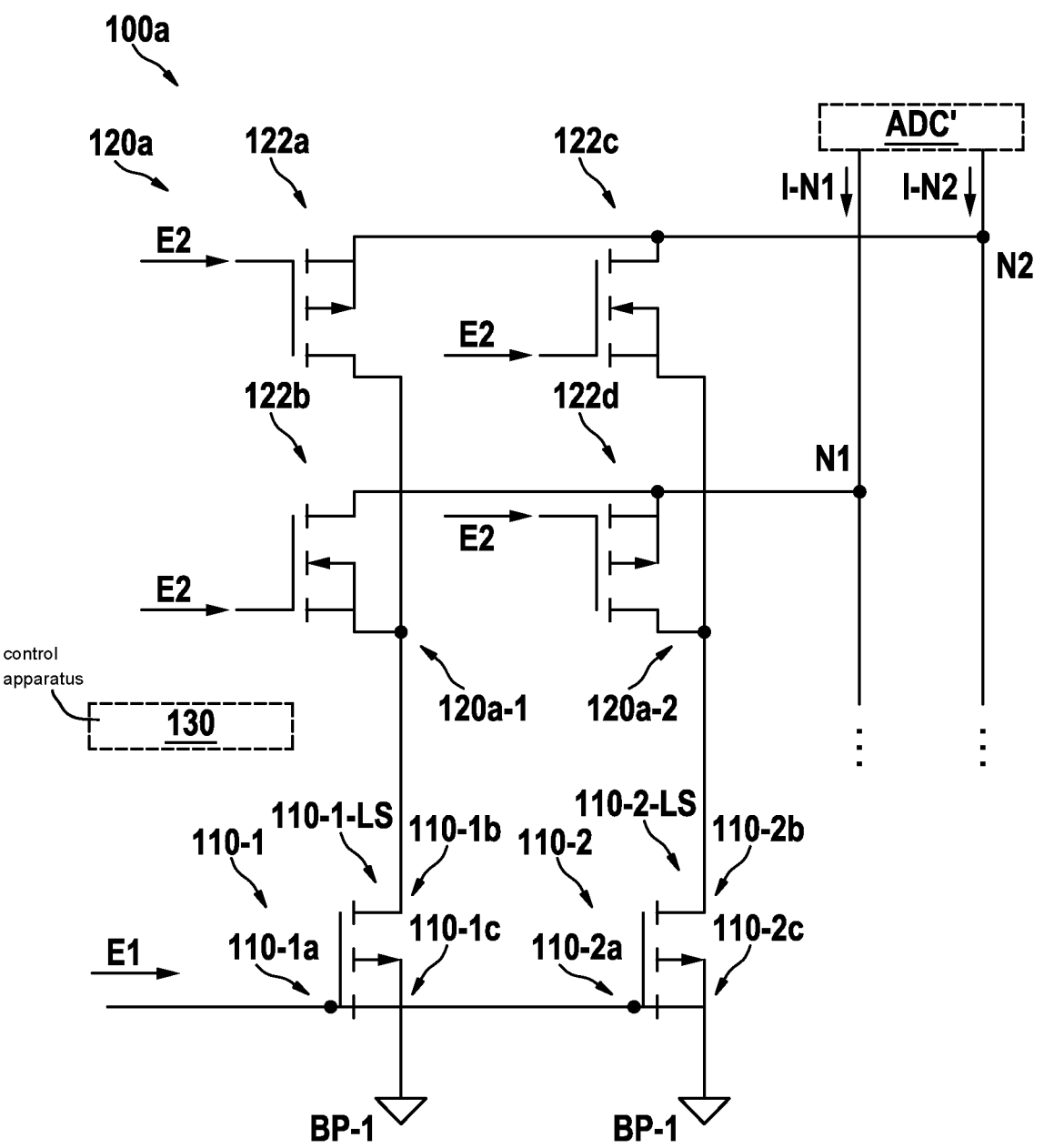
FIG. 5 schematically shows a simplified circuit diagram according to exemplary embodiments of the present invention.
Figure 6:
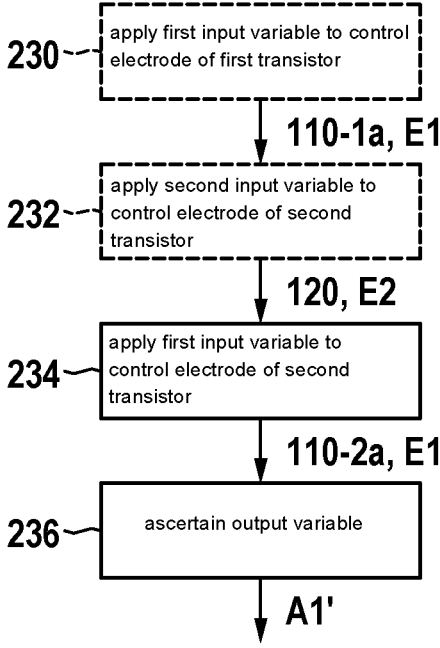
FIG. 6 schematically shows a simplified flow diagram according to exemplary embodiments of the present invention.

With further exemplary embodiments, see FIG. 5, 6, two transistors 110-1, 110-2 are used by way of example in an apparatus 100a, both of which are connected to the current leakage device 120a (FIG. 5). An exemplary method is symbolized in FIG. 6. For example, it is provided that the method comprises: application 234 of the first input variable E1 to a control electrode 110-2a (FIG. 5) of the second transistor 110-2, wherein the current leakage device 120a is designed, if the second input variable E2 has a first state, to connect the load path 110-1-LS of the first transistor 110-1 to the first circuit node N1 and a load path 110-2-LS of the second transistor 110-2 to the second circuit node N2, wherein the current leakage device 120a is designed, if the second input variable E2 has a second state, to connect the load path 110-1-LS of the first transistor 110-1 to the second circuit node N2 and the load path 110-2-LS of the second transistor 110-2 to the first circuit node N1.

Optionally, the method according to FIG. 6 comprises the further steps 230, 232, which correspond, for example, to steps 200, 202 according to FIG. 1.

Based on the blocks 230, 232, 234, an output variable A1' can be ascertained, for example in block 236 according to FIG. 6, which depends, for example, on the input variables E1, E2 and possibly properties of the transistors 110-1, 110-2 (for example, threshold voltage, resistance in a low-ohmic state, . . . ), for example, analogously to the ascertainment of the output variable A1 according to block 204 of FIG. 1.

Figure 7:
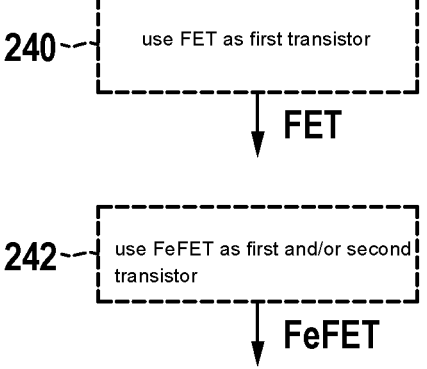
FIG. 7 schematically shows a simplified flow diagram according to exemplary embodiments of the present invention.

With further exemplary embodiments, FIG. 7, it is provided that the method comprises: use 240 of a field effect transistor, FET, for example MOSFET, as the first transistor 110-1 and/or a or the second transistor 110-2.

With further exemplary embodiments, FIG. 7, it is provided that the method comprises: use 242 of a ferroelectric field effect transistor, FeFET, as the first transistor 110-1 and/or a or the second transistor 110-2.

Figure 8A:
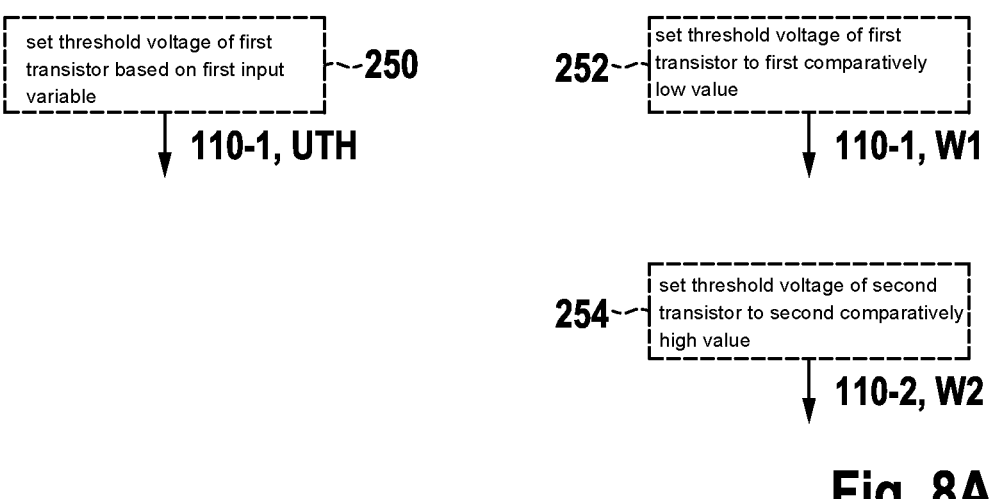
FIG. 8A schematically shows a simplified flow diagram according to exemplary embodiments of the present invention.

With further exemplary embodiments, FIG. 8A, it is provided that the method comprises at least one of the following elements: a) setting, for example programming, 250 of a threshold voltage UTH of at least the first transistor 110-1 (or, for example, both transistors 110-1, 110-2) based on the first input variable E1 (for example, in the event of the design of transistors 110-1, 110-2 as FeFETs), b) setting 252 of a threshold voltage of the first transistor 110-1 to a first, for example comparatively low, value W1 (for example with respect to possible values of the first input variable E1), c) setting 254 of a threshold voltage of the second transistor 110-2 to a second, for example comparatively high, value W2 (for example with respect to possible values of the first input variable E1).

Figure 8B:
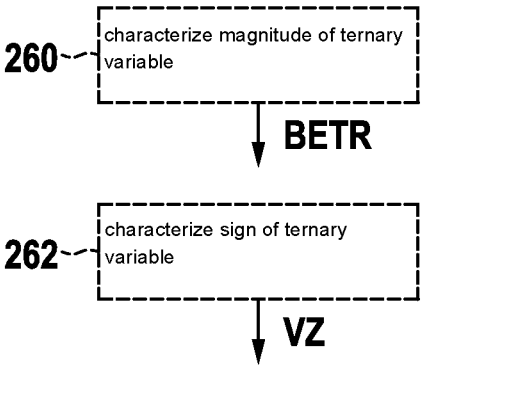
FIG. 8B schematically shows a simplified flow diagram according to exemplary embodiments of the present invention.

With further exemplary embodiments, FIG. 8B, it is provided that the method comprises: characterizing, for example encoding, 260 of a magnitude BETR of a ternary variable by means of at least the first transistor 110-1 and/or the first input variable E1; characterizing, for example encoding, 262 of a sign VZ (for example, plus, "+," or minus, "−") of the ternary variable by means of the second input variable E2.

Further exemplary embodiments, FIG. 2, 5, relate to an apparatus 100, 100a for carrying out the method according to the embodiments.

With further exemplary embodiments, it is provided that the apparatus 100, 100a has the first transistor 110-1, the current leakage device 120, 120a, and, optionally, at least one or the second transistor 110-2, wherein, for example, the apparatus 100, 100a has an optional control apparatus 130 for controlling at least one aspect of the method according to the embodiments.

With further exemplary embodiments, FIG. 5, it is provided that the first transistor 110-1 and the second transistor 110-2 are provided (for example, in each case designed as a FeFET), wherein the first input variable E1 can be applied to control electrodes 110-1a, 110-2a of the first transistor 110-1 and of the second transistor 110-2, wherein, for example, the control electrodes 110-1a, 110-2a of the first transistor 110-1 and of the second transistor 110-2 are connected to one another.

With further exemplary embodiments, it is provided that a) a first terminal 110-1*b* of a load path 110-1-LS (for example, a drain-source path) of the first transistor 110-1 is connected to a first terminal 120*a*-1 of the current leakage device 120*a* and/or *b*) that a second terminal 110-1*c* of the load path 110-1-LS of the first transistor 110-1 is connected to a or the first reference potential, for example ground potential, BP-1, and/or that c) a first terminal 110-2*b* of a load path 110-2-LS of the second transistor 110-2 is connected to a second terminal 120*a*-2 of the current leakage device 120*a* and/or *d*) that a second terminal 110-2*c* of a load path 110-2-LS of the second transistor 110-2 is connected to the first reference potential BP-1. Thus, the transistors 110-1, 110-2 can leak currents via the current leakage device 120*a* from the circuit nodes N1, N2 to the ground potential BP-1 based, among other things, on the first input variable E1 and on the second input variable E2.

With further exemplary embodiments, FIG. 5, it is provided that the current leakage device 120*a* has a first transistor 122*a*, wherein the first terminal 120*a*-1 of the current leakage device 120*a* can be selectively connected to the second circuit node N2 by means of the first transistor 122*a* based on the second input variable E2, wherein the current leakage device 120*a* has a second transistor 122*b*, wherein the first terminal 120*a*-1 of the current leakage device 120*a* can be selectively connected to the first circuit node N1 by means of the second transistor 122*b* based on the second input variable E2.

With further exemplary embodiments, FIG. 5, it is provided that the current leakage device 120*a* has a third transistor 122*c*, wherein the second terminal 120*a*-2 of the current leakage device 120*a* can be selectively connected to the second circuit node N2 by means of the third transistor 122*c* based on the second input variable E2, wherein the current leakage device 120*a* has a fourth transistor 122*d*, wherein the second terminal 120*a*-2 of the current leakage device 120*a* can be selectively connected to the first circuit node N1 by means of the fourth transistor 122*d* based on the second input variable E2.

With further exemplary embodiments, the first transistor 122*a* of the current leakage device 120*a* is, for example, a FET, for example of the PMOS type. With further exemplary embodiments, the second transistor 122*b* of the current leakage device 120*a* is, for example, a FET, for example of the NMOS type. With further exemplary embodiments, the third transistor 122*c* of the current leakage device 120*a* is, for example, a FET, for example of the NMOS type. With further exemplary embodiments, the fourth transistor 122*d* of the current leakage device 120*a* is, for example, a FET, for example of the PMOS type.

With further exemplary embodiments, the first transistor 110-1 is, for example, an NMOS-based FeFET, for example like the second transistor 110-2.

With further exemplary embodiments, the apparatus 100*a* according to FIG. 5 can be used, for example, to carry out MAC operations, as can be used, for example, for an evaluation of neural networks (inference). For example, a ternary input characteristic can be encoded by means of the first input variable E1 (for example for the magnitude, for example 1 or 0) and the second input variable E2 (for example for the sign "+" or "−"), wherein, for example, a weight can be encoded by means of the FeFETs 110-1, 110-2, for example by a corresponding programming of the threshold voltage of the FeFETs.

With further exemplary embodiments, FIG. 5, both FeFETs are programmed to a comparatively low voltage threshold (LVT mode) if, for example, they are to characterize, for example store, a value of logic "1." In this case, the FeFETs 110-1, 110-2 can be activated (set to a low-ohmic state), for example, if a non-vanishing gate voltage is applied to the relevant gate electrode 110-1*a*, 110-2*a*.

With further exemplary embodiments, FIG. 5, both FeFETs are, for example, programmed to a comparatively high threshold voltage (HVT mode) if, for example, they are to characterize, for example store, a value of logic "0." In this case, the FeFETs 110-1, 110-2, for example, cannot be activated if the non-vanishing gate voltage is applied.

With further exemplary embodiments, a "1" is encoded, for example, in that a first FeFET of the two FeFETs, for example the first FeFET 110-1 in the present case, is programmed with an LVT, i.e., to a comparatively low threshold voltage, and that a second of the two FeFETs, for example the second FeFET 110-2 in the present case, is programmed with an HVT, i.e., to a comparatively high threshold voltage.

If, for example, it is assumed with further exemplary embodiments that the value of "logic 1" is encoded by programming the FeFET 110-1 to an LVT, and by programming the FeFET 110-2 to an HVT, a value of "−1" can be encoded, for example, by inverting the states of the two FeFETs 110-1, 110-2, i.e., by programming the FeFET 110-1 to an HVT, and by programming the FeFET 110-2 to an LVT.

As already described above, with exemplary embodiments, the current leakage device 120*a* makes it possible to selectively connect the respective load paths 110-1-LS, 110-2-LS of the FeFETs 110-1, 110-2 to one of the circuit nodes N1, N2 based on the second input variable E2. Thus, with further exemplary embodiments, a first of the two circuit nodes N1, N2 can, for example, "collect" processing results or calculation results which are associated with positive values, for example "+1," i.e., combine them (by adding the respective currents), wherein a second of the two circuit nodes N1, N2 can, for example, "collect" processing results or calculation results which are associated with negative values, for example "−1," i.e., combine them (by adding the respective currents).

For example, with further embodiments, more than the two FeFETs 110-1, 110-2 described above by way of example can be provided, wherein the further FeFETs can be connected with their respective load paths to the circuit nodes N1, N2 in a manner comparable to FIG. 5, for example via corresponding further current leakage devices (not shown, see the vertical dots in FIG. 5 on the right), so that the respective currents in the circuit nodes N1, N2 add up.

With further exemplary embodiments, the differential analog-to-digital converter device ADC' is preferably used in order to detect the currents I-N1, I-N2 through the circuit nodes N1, N2, because this allows leakage currents through, for example, momentarily deactivated FeFETs to be eliminated so that the output variable A1, A1' is not affected thereby.

With further exemplary embodiments, the FeFETs 110-1, 110-2 can, for example, also be programmed with further different values (than, for example, the two exemplary values mentioned above) for their respective threshold voltage, as a result of which further degrees of freedom for the processing of the input variables arise. By way of example, the values of "−2," "−1," "0," "1," "2" can, for example, be encoded with such configurations.

Figure 9:
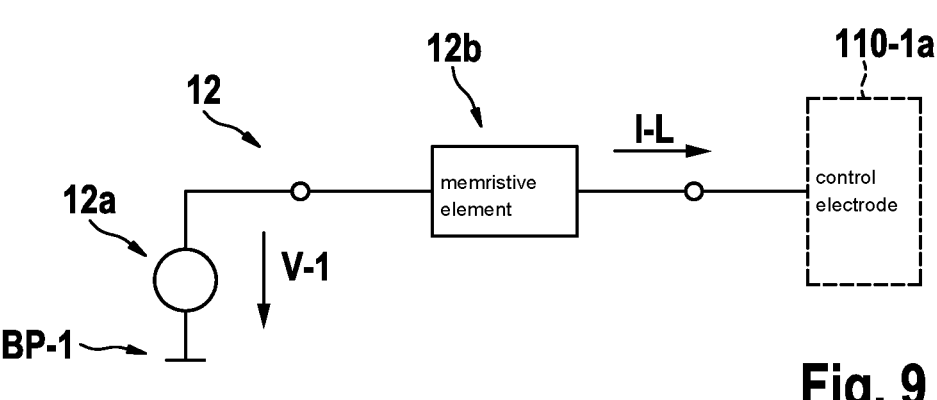
FIG. 9 schematically shows a simplified circuit diagram according to exemplary embodiments of the present invention.

With further exemplary embodiments, FIG. 9, at least one transistor 110-1 (see also FIG. 2, 5) can be assigned, for example, a memristive element 12*b*, which can influence, for example, a charging current I-L for a gate electrode 110-1*a* of the transistor 110-1 based on its memory value or resistance value. FIG. 9 shows an example of a voltage source 12*a*, which provides a charging voltage V-1 for the gate electrode 110-1*a* of the transistor 110-1, wherein the charging voltage V-1 can be provided via the memristive element 12*b* for the gate electrode 110-1*a* of the transistor 110-1 as shown. The exemplary configuration 12 shown in FIG. 9 can be used with further exemplary embodiments for one or more transistors 110-1, 110-2, . . . of the apparatus 100, 100*a*, for example for providing or influencing the first input variable E1 (FIG. 2).

Figure 10:
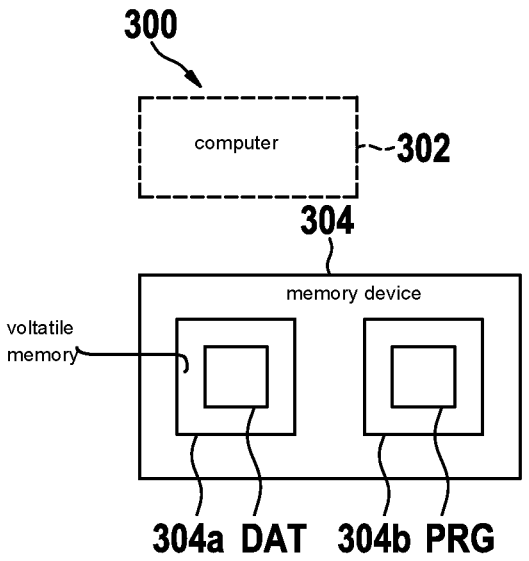
FIG. 10 schematically shows a simplified block diagram according to exemplary embodiments of the present invention.
Figure 10:
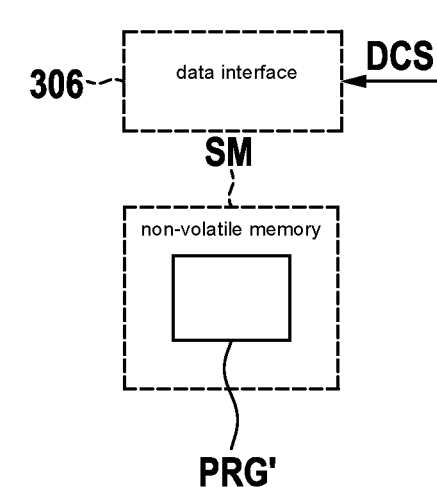

FIG. 10 schematically shows a simplified block diagram of a configuration 300 according to exemplary embodiments, by means of which, for example, the optional control apparatus 130 (FIG. 2, 5) can be realized.

The configuration or apparatus 300 has, for example, a computing device ("computer") 302 having at least one computing core, and a memory device 304 assigned to the computing device 302 for at least temporarily storing at least one of the following elements: a) data DAT (for example, data associated with the first input variable E1 and/or the second input variable E2 and/or the output variable A1, A1'), b) computer program PRG, for example for carrying out the method according to the embodiments.

With further exemplary embodiments, the memory device 304 has a volatile memory (for example, a random access memory (RAM)) 304*a*, and/or a non-volatile (NVM) memory (for example, a flash EEPROM) 304*b*, or a combination thereof or with other types of memory not explicitly mentioned.

Further exemplary embodiments, FIG. 10, relate to a computer-readable storage medium SM comprising commands PRG' that, when executed by a computer 302, cause said computer to carry out the method according to the embodiments.

Further exemplary embodiments relate to a computer program PRG, PRG' comprising commands that, when the program PRG, PRG' is executed by a computer 302, cause said computer to carry out the method according to the embodiments.

Further exemplary embodiments relate to a data carrier signal DCS that characterizes and/or transmits the computer program PRG, PRG' according to the embodiments. The data carrier signal DCS can be received, for example, via an optional data interface 306 of the apparatus 300.

With further exemplary embodiments, the apparatus 300 can, for example, at least temporarily control at least one of the following aspects: a) provision of the first input variable E1, b) provision of the second input variable E2, c) ascertainment of the output variable A1, A1', d) programming of any FeFETs present (for example, of their threshold voltage(s)), e) programming of any memristive elements 12*b* present.

Figure 11:
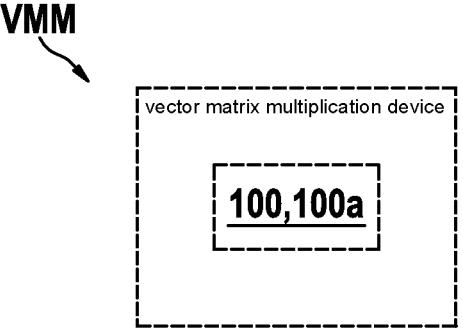
FIG. 11 schematically shows a simplified block diagram according to further exemplary embodiments, FIG. 12 schematically shows aspects of uses according to exemplary embodiments of the present invention.

Further exemplary embodiments, FIG. 11, relate to a computing device, for example a vector matrix multiplication device (VMM), having at least one apparatus 100, 100*a* according to the embodiments. With further exemplary embodiments, the first and/or second input variable E1, E2 can, for example, be assigned to aspects or partial aspects of a vector matrix multiplication, which can be carried out using the apparatus 100, 100*a* (possibly supplemented by a corresponding number of further transistors and/or current leakage devices), for example can be carried out on a hardware basis.

Figure 12:
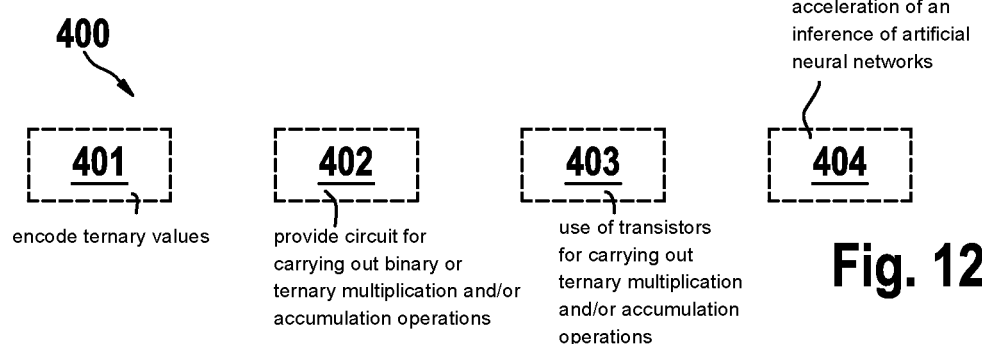

Further exemplary embodiments, FIG. 12, relate to a use 400 of the method according to the embodiments and/or of the apparatus 100, 100*a* according to the embodiments and/or of the computing device VMM according to the embodiments and/or of the computer-readable storage medium SM according to the embodiments and/or of the computer program PRG, PRG' according to the embodiments and/or of the data carrier signal DCS according to the embodiments for at least one of the following aspects: a) encoding 401 of, for example ternary, values, for example weights, for example for an artificial neural network, b) provision 402 of a circuit for carrying out, for example binary or ternary, multiplication and/or accumulation operations, for example multiply and accumulate (MAC), c) use 403 of transistors, for example of the FeFET type, for carrying out ternary multiplication and/or accumulation operations, for example multiply and accumulate (MAC), d) acceleration 404, for example hardware-based acceleration, of an inference of, for example ternary, artificial neural networks.

As an example, the apparatus 100*a* according to FIG. 5 can be used, for example, to carry out the following calculations: $1*1=1$, where '*' is the scalar multiplication operator, $0*1=0$, $1*0=0$, $0*-1=0$, $-1*0=0$, $1*-1=-1$, $-1*1=-1$, $-1*-1=1$.

The project leading to this application has received funding from the ECSEL Joint Undertaking (JU) under grant agreement No 826655. The JU receives support from the European Union's Horizon 2020 research and innovation program and Belgium, France, Germany, Netherlands, Switzerland.

The invention claimed is:

1. A method for processing input variables, comprising the following steps:
   applying a first input variable to a control electrode of a first transistor; and
   applying a second input variable to a current leakage device, wherein the current leakage device is configured to connect a load path of the first transistor selectively to a first circuit node or a second circuit node based on the second input variable, and
   wherein the second input variable is a binary variable, and wherein the second input variable characterizes a sign, the sign being "plus" or "minus".

2. The method according to claim 1, further comprising:
   ascertaining an output variable based on at least one of the following elements:
   a) a variable that characterizes a current flowing through the first circuit node, b) a variable that characterizes a current flowing through the second circuit node.

3. The method according to claim 2, further comprising:
   ascertaining the variable that characterizes the current flowing through the first circuit node using a first current-based analog-to-digital converter device; and
   ascertaining the variable that characterizes the current flowing through the second circuit node using a second current-based analog-to-digital converter device.

4. The method according to claim 2, further comprising:
   ascertainment a difference between the variable that characterizes the current flowing through the first circuit node and the variable that characterizes the current flowing through the second circuit node, using a differential current-based analog-to-digital converter device.

5. The method according to claim 1, wherein the first input variable is a binary variable.

6. The method according to claim 1, further comprising:

applying the first input variable to a control electrode of a second transistor, wherein the current leakage device is configured to, when the second input variable has a first state, connect the load path of the first transistor to the first circuit node and a load path of the second transistor to the second circuit node, and wherein the current leakage device is configured to, when the second input variable has a second state, connect the load path of the first transistor to the second circuit node and the load path of the second transistor to the first circuit node.

7. The method according to claim 6, wherein a field effect transistor is used as the first transistor and/or the second transistor.

8. The method according to claim 6, wherein a ferroelectric field effect transistor is used as the first transistor and/or as the second transistor.

9. The method according to claim 8, further comprising at least one of the following elements: a) setting a threshold voltage of at least the first transistor based on the first input variable, b) setting a threshold voltage of the first transistor to a first comparatively low value, c) setting a threshold voltage of the second transistor to a second comparatively high value.

10. A method for processing input variables, comprising the following steps:

applying a first input variable to a control electrode of a first transistor;

applying a second input variable to a current leakage device, wherein the current leakage device is configured to connect a load path of the first transistor selectively to a first circuit node or a second circuit node based on the second input variable;

encoding a magnitude of a ternary variable using at least the first transistor and/or the first input variable; and encoding a sign of the ternary variable using the second input variable.

11. An apparatus configured to process input variables, the apparatus configured to:

apply a first input variable to a control electrode of a first transistor; and apply a second input variable to a current leakage device, wherein the current leakage device is configured to connect a load path of the first transistor selectively to a first circuit node or a second circuit node based on the second input variable, and wherein the second input variable is a binary variable, and wherein the second input variable characterizes a sign, the sign being "plus" or "minus".

12. The apparatus according to claim 11, wherein the apparatus comprising the first transistor, and the current leakage device, and a control apparatus for controlling the applying of the first input variable and/or the applying of the second input variable.

13. The apparatus according to claim 11, wherein a second transistor is provided, wherein the first input variable can be applied to control electrodes of the first transistor and of the second transistor, and wherein the control electrodes of the first transistor and of the second transistor are connected to one another.

14. The apparatus according to claim 13, wherein a) a first terminal of a load path of the first transistor is connected to a first terminal of the current leakage device, and/or b) a second terminal of a load path of the first transistor is connected to a first reference potential, and/or c) a first terminal of a load path of the second transistor is connected to a second terminal of the current leakage device, and/or d) a second terminal of a load path of the second transistor is connected to the first reference potential.

15. The apparatus according to claim 14, wherein the current leakage device includes a first transistor, wherein the first terminal of the current leakage device can be selectively connected to the second circuit node by the first transistor based on the second input variable, wherein the current leakage device has a second transistor, wherein the first terminal of the current leakage device can be selectively connected to the first circuit node by the second transistor based on the second input variable.

16. An apparatus configured to process input variables, the apparatus configured to:

apply a first input variable to a control electrode of a first transistor; and apply a second input variable to a current leakage device, wherein the current leakage device is configured to connect a load path of the first transistor selectively to a first circuit node or a second circuit node based on the second input variable, wherein a second transistor is provided, wherein the first input variable can be applied to control electrodes of the first transistor and of the second transistor, and wherein the control electrodes of the first transistor and of the second transistor are connected to one another, wherein a) a first terminal of a load path of the first transistor is connected to a first terminal of the current leakage device, and/or b) a second terminal of a load path of the first transistor is connected to a first reference potential, and/or c) a first terminal of a load path of the second transistor is connected to a second terminal of the current leakage device, and/or d) a second terminal of a load path of the second transistor is connected to the first reference potential, wherein the current leakage device includes a first transistor, wherein the first terminal of the current leakage device can be selectively connected to the second circuit node by the first transistor based on the second input variable, wherein the current leakage device has a second transistor, wherein the first terminal of the current leakage device can be selectively connected to the first circuit node by the second transistor based on the second input variable, and wherein the current leakage device has a third transistor, wherein the second terminal of the current leakage device can be selectively connected to the second circuit node by the third transistor based on the second input variable, wherein the current leakage device has a fourth transistor, wherein the second terminal of the current leakage device can be selectively connected to the first circuit node by the fourth transistor based on the second input variable.

17. A computing device, comprising:

an apparatus configured to process input variables, the apparatus configured to:

apply a first input variable to a control electrode of a first transistor; and apply a second input variable to a current leakage device, wherein the current leakage device is configured to connect a load path of the first transistor selectively to a first circuit node or a second circuit node based on the second input variable, and wherein the second input variable is a binary variable, and wherein the second input variable characterizes a sign, the sign being "plus" or "minus".

18. A non-transitory computer-readable storage medium on which are stored commands for processing input variables, the commands, when executed by a computer, causing the computer to perform the following steps:

applying a first input variable to a control electrode of a first transistor; and applying a second input variable to a current leakage device, wherein the current leakage device is configured to connect a load path of the first transistor selectively to a first circuit node or a second circuit node based on the second input variable, and wherein the second input variable is a binary variable, and wherein the second input variable characterizes a sign, the sign being "plus" or "minus".

19. An apparatus configured to process input variables, the apparatus configured to:

apply a first input variable to a control electrode of a first transistor; and apply a second input variable to a current leakage device, wherein the current leakage device is configured to connect a load path of the first transistor selectively to a first circuit node or a second circuit node based on the second input variable, and wherein the apparatus is used for: a) encoding ternary values including weights, b) providing a circuit for carrying out binary or ternary multiplication and/or accumulation operations, c) use of transistors for carrying out ternary multiplication and/or accumulation operations, d) hardware-based acceleration of an inference of a ternary artificial neural network.

* * * * *